US012313700B2

(12) United States Patent
Ku

(10) Patent No.: US 12,313,700 B2
(45) Date of Patent: May 27, 2025

(54) ELECTRIC-LEAKAGE DETECTION DEVICE, ELECTRIC-LEAKAGE DETECTION SYSTEM USING THE SAME, AND ELECTRIC-LEAKAGE DETECTION METHOD USING THE SAME

(71) Applicant: LEOTEK CORPORATION, Taipei (TW)

(72) Inventor: Po-Yi Ku, Taipei (TW)

(73) Assignee: LEOTEK CORPORATION, Taipei (TW)

( * ) Notice: Subject to any disclaimer, the term of this patent is extended or adjusted under 35 U.S.C. 154(b) by 167 days.

(21) Appl. No.: 18/110,645

(22) Filed: Feb. 16, 2023

(65) Prior Publication Data

US 2024/0175938 A1    May 30, 2024

(30) Foreign Application Priority Data

Nov. 30, 2022   (CN) .......................... 202211522338.4

(51) Int. Cl.
*G01R 31/52*   (2020.01)
*G08B 21/18*   (2006.01)

(52) U.S. Cl.
CPC ........... *G01R 31/52* (2020.01); *G08B 21/185* (2013.01)

(58) Field of Classification Search
CPC ...... G01R 31/52; G01R 1/02; G01R 19/0084; G08B 21/185
See application file for complete search history.

(56) References Cited

U.S. PATENT DOCUMENTS

| | | | | |
|---|---|---|---|---|
| 2004/0243288 | A1* | 12/2004 | Kito | ........................ B60K 6/48 |
| | | | | 702/183 |
| 2005/0152079 | A1* | 7/2005 | Asai | ......................... H02H 3/33 |
| | | | | 361/42 |
| 2009/0316312 | A1* | 12/2009 | Kim | ....................... H02H 3/337 |
| | | | | 361/42 |
| 2013/0155563 | A1* | 6/2013 | Huang | ............... H01R 13/7135 |
| | | | | 361/93.1 |
| 2017/0222425 | A1 | 8/2017 | Li et al. | |
| 2022/0099755 | A1* | 3/2022 | Yano | ...................... G01R 31/52 |
| 2023/0314497 | A1* | 10/2023 | Nayak | .................. H02H 1/0007 |

FOREIGN PATENT DOCUMENTS

CN   110635453 A   * 12/2019

OTHER PUBLICATIONS

Taiwan Office Action corresponding to Application No. 111146011 and issued on Nov. 30, 2023, 6 pages.

* cited by examiner

*Primary Examiner* — Lee E Rodak
*Assistant Examiner* — Demetrius R Pretlow
(74) *Attorney, Agent, or Firm* — Innovation Counsel LLP

(57) ABSTRACT

An electric-electric-leakage detection device includes an electric-leakage detection module, a switch module and an indicator. The electric-leakage detection module is configured for converting an AC electric-leakage voltage into a DC electric-leakage voltage. The switch module is electrically connected to the electric-leakage detection module and configured for being turned on or turned off according to the DC electric-leakage voltage. The indicator is electrically connected to the switch module and configured for outputting an indication signal according to conduction of the switch module.

18 Claims, 4 Drawing Sheets

ELECTRIC-LEAKAGE DETECTION DEVICE, ELECTRIC-LEAKAGE DETECTION SYSTEM USING THE SAME, AND ELECTRIC-LEAKAGE DETECTION METHOD USING THE SAME

This application claims the benefit of People's Republic of China application Serial No. 202211522338.4, filed Nov. 30, 2022, the subject matter of which is incorporated herein by reference.

BACKGROUND OF THE INVENTION

Field of the Invention

The invention relates in general to an electric-leakage detection device, an electric-leakage detection system using the same, and an electric-leakage detection method using the same.

Description of the Related Art

An electronic equipment operates using electricity, and an electric-leakage may occur, so that people around the electronic equipment may be in danger of electric shock. For example, in the rainy season or after a typhoon, pedestrian walking on the road may be subjected to electric shock accidents due to the electric-leakage of the light pole if the pedestrian touches the light pole. Therefore, there is a need to propose an electric-leakage detection system to warn people that leakage has occurred in electronic equipment.

SUMMARY OF THE INVENTION

The present invention provides an electric-leakage detection device, an electric-leakage detection system using the same and an electric-leakage detection method using the same capable of resolving the above problems.

According to an embodiment of the present invention, an electric-leakage detection device is provided. The electric-leakage detection device includes an electric-leakage detection module, a switch module and an indicator. The electric-leakage detection module is configured to convert an AC electric-leakage voltage into a DC electric-leakage voltage. The switch module is electrically connected to the electric-leakage detection module and configured to be turned on or turned off according to the DC electric-leakage voltage. The indicator is electrically connected to the switch module and configured to output an indication signal according to conduction of the switch module. The electric-leakage detection module is electrically connected to a neutral wire of a power system and a lamp to receive the AC electric-leakage voltage.

According to an embodiment of the present invention, an electric-leakage detection system is provided. The electric-leakage detection system includes an electric-leakage detection device and a lamp. The electric-leakage detection device is disposed on the lamp and configured to detect the AC electric-leakage voltage from the lamp. The electric-leakage detection device includes an electric-leakage detection module, a switch module and an indicator. The electric-leakage detection module is configured to convert an AC electric-leakage voltage into a DC electric-leakage voltage. The switch module is electrically connected to the electric-leakage detection module and configured to be turned on or turned off according to the DC electric-leakage voltage. The indicator is electrically connected to the switch module and configured to output an indication signal according to conduction of the switch module. The electric-leakage detection module is electrically connected to a neutral wire of a power system and a lamp to receive the AC electric-leakage voltage.

According to an embodiment of the present invention, an electric-leakage detection method is provided. The electric-leakage detection method includes the following steps: converting an AC electric-leakage voltage into a DC electric-leakage voltage by an electric-leakage detection module; controlling a switch module to be turned on or turned off by to the DC electric-leakage voltage; and outputting an indication signal according to the conduction of the switch module by an indicator.

The above and other aspects of the invention will become better understood with regard to the following detailed description of the preferred but non-limiting embodiment (s). The following description is made with reference to the accompanying drawings.

DETAILED DESCRIPTION OF THE INVENTION

Figure 1:
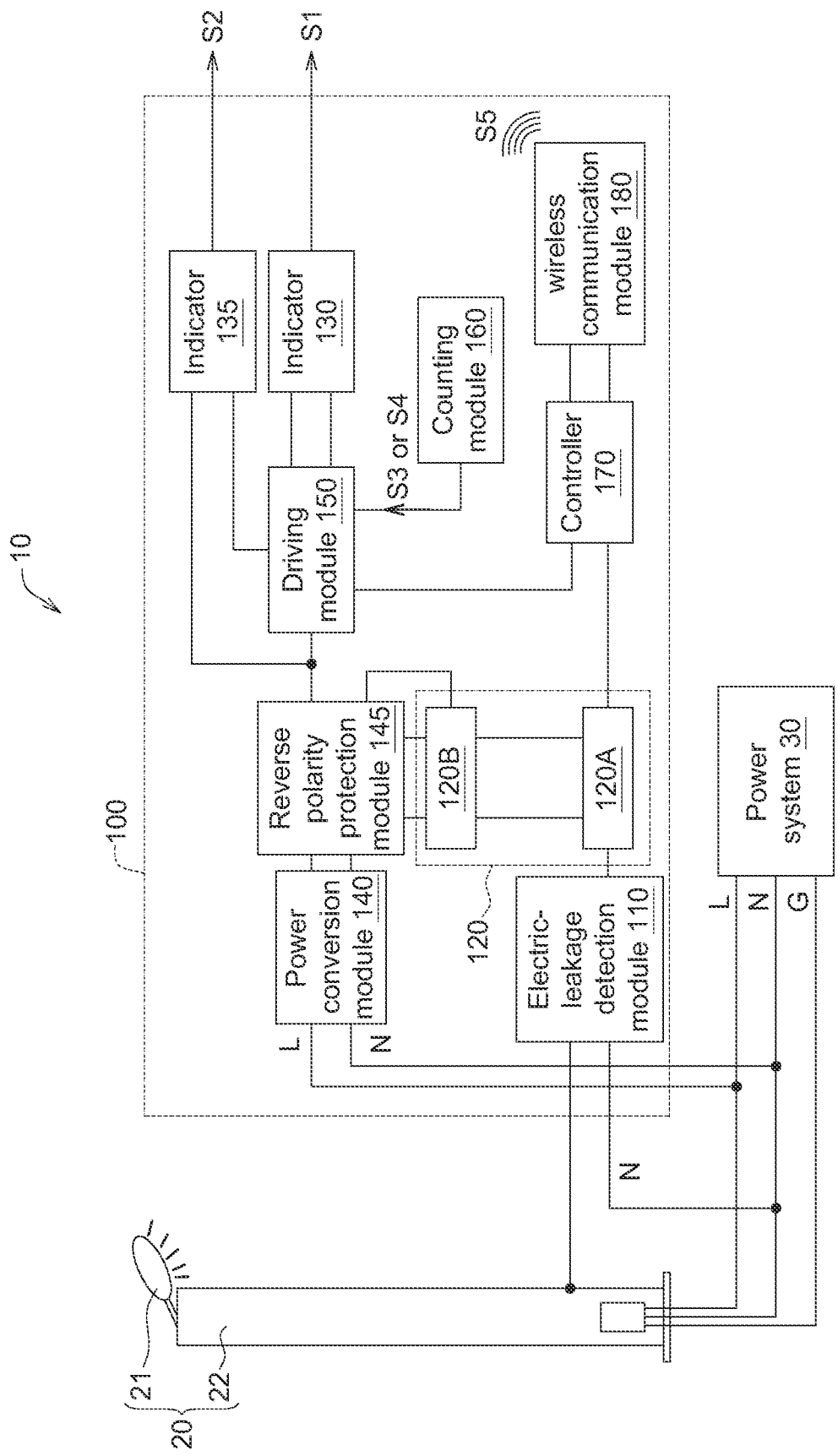
FIG. 1 shows a schematic diagram of an electric-leakage detection system according to an embodiment of the present invention.
Figure 2:
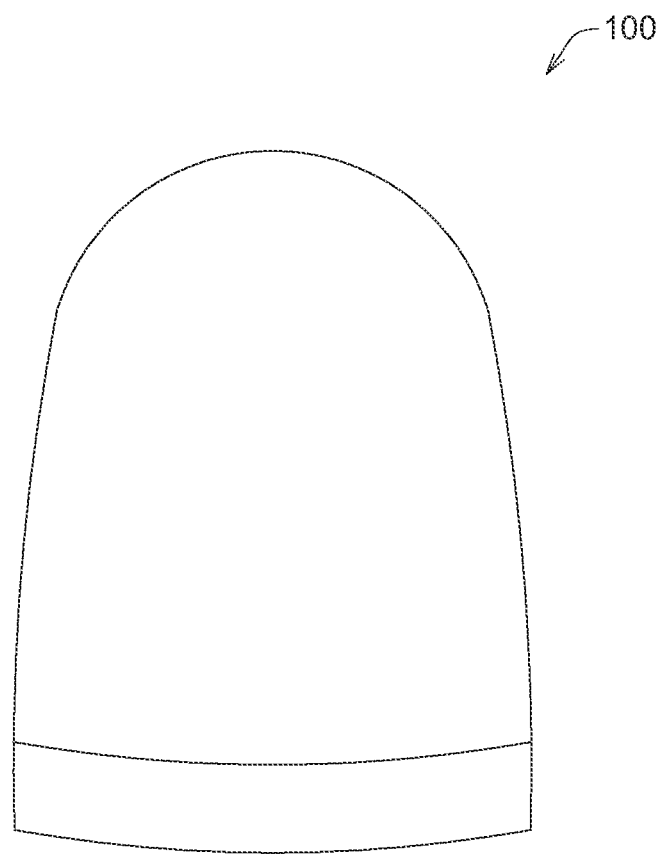
FIG. 2 shows a schematic diagram of an appearance of the electric-leakage detection device of FIG. 1.
Figure 3:
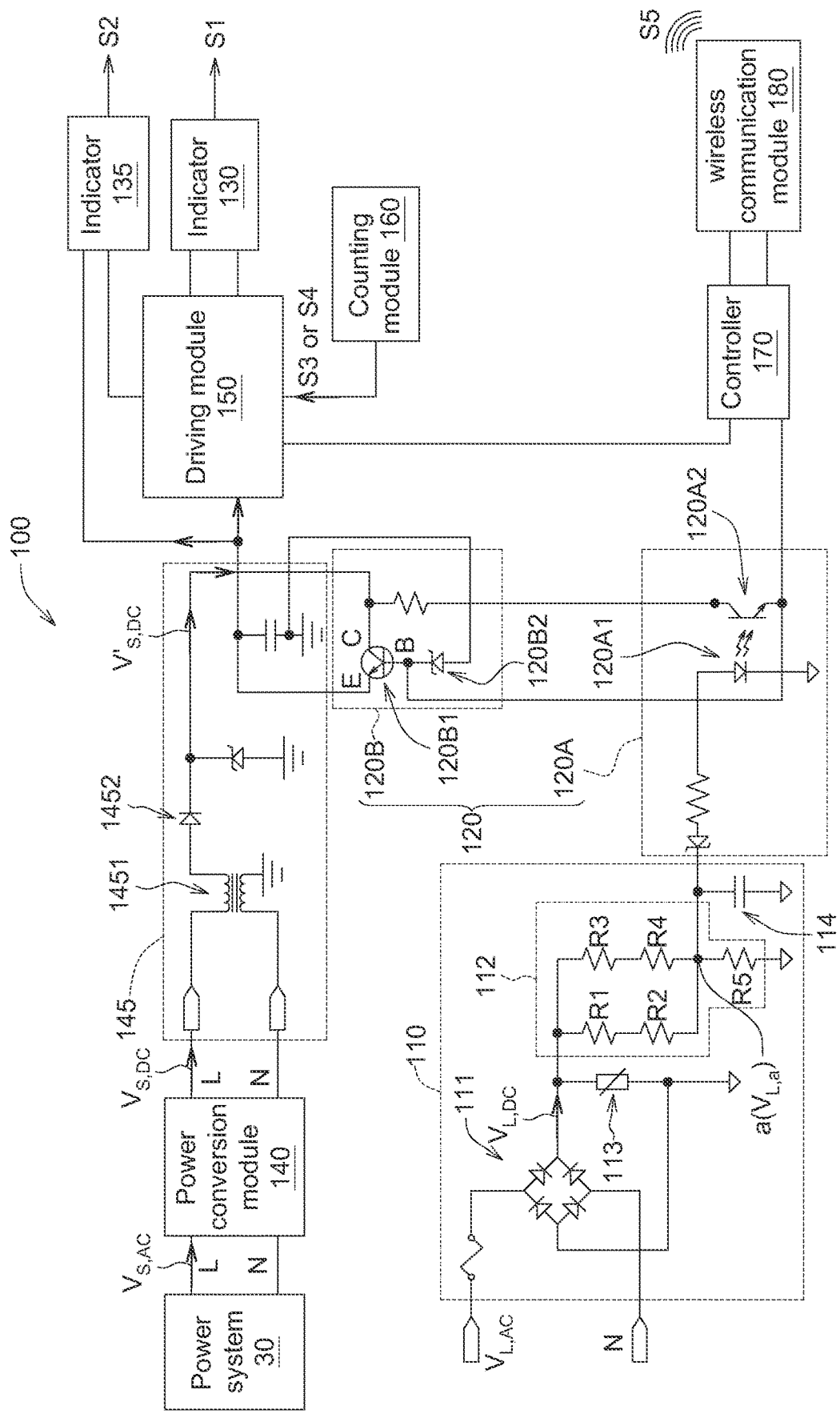
FIG. 3 shows a schematic circuit diagram of a portion of the electric-leakage detection device in FIG. 2; and Referring to FIG. 4, which shows a flow chart of the electric-leakage detection method of the electric-leakage detection device in FIG. 1.

Referring to FIGS. 1 to 3, FIG. 1 shows a schematic diagram of an electric-leakage detection system 10 according to an embodiment of the present invention, FIG. 2 shows a schematic diagram of an appearance of the electric-leakage detection device 100 of FIG. 1, and FIG. 3 shows a schematic circuit diagram of a portion of the electric-leakage detection device 100 in FIG. 2.

As shown in FIGS. 1 to 3, the electric-leakage detection system 10 includes an electric-leakage detection device 100 and an electronic equipment 20. The appearance of the electric-leakage detection device 100 is, for example, a warning light (as shown in FIG. 2), which could be disposed or connected to the electronic equipment 20. In addition, the embodiment of the present invention does not limit the size and/or the appearance of the electric-leakage detection device 100. The electronic equipment 20 is, for example, a street lamp, a home appliance or other electronic products which could be driven by alternating current. The electronic equipment 20 of the embodiment of the present invention is described by taking a street lamp as an example.

As shown in FIGS. 1 to 3, the electronic equipment 20 could include a light-emitting element 21 and a light pole 22, wherein the light-emitting element 21 is disposed on the light pole 22, for example, at the top of the light pole 22. The light-emitting element 21 could be electrically connected to a power system 30 to receive power from the power system 30 for illuminating. The power system 30 could provide alternating current, such as 110 volts (V) or 220 V. In an embodiment, the power system 30 is, for example, a mains electricity. In the power system 30 in FIG. 1, L represents a live wire, N represents a neutral wire, and G represents a ground wire. The electric-leakage detection device 100 is electrically connected to the power system 30 to receive power from the power system 30 for normal operation. The electric-leakage detection device 100 is further electrically coup connected to the electronic equipment 20. When an electric-leakage occurs in the electronic equipment 20, the electric-leakage detection device 100 could send an indication signal S1 to remind the user of the electric-leakage.

The electric-leakage detection device 100 could be disposed on the light pole 22, for example, at a position and/or height easily observed by the pedestrians, but the embodiment of the present invention is not limited thereto. In another embodiment, the electric-leakage detection device 100 and the light pole 22 could be disposed separately, and connected by at least one wire.

As shown in FIGS. 1 and 3, the electric-leakage detection device 100 includes an electric-leakage detection module 110, a switch module 120, an indicator 130, an indicator 135, a power conversion module 140, a reverse polarity protection module 145, a driving module 150, a counting module 160, a controller 170 and a wireless communication module 180. The electric-leakage detection module 110, the switch module 120, the indicator 130, the indicator 135, the power conversion module 140, the reverse polarity protection module 145, the driving module 150, the counting module 160, the controller 170 and/or the wireless communication module 180 is, for example, a physical circuit formed by at least one semiconductor manufacturing process.

The electric-leakage detection module 110 is configured to convert an AC electric-leakage voltage $V_{L,AC}$ into a DC electric-leakage voltage $V_{L,DC}$. The switch module 120 is electrically connected to the electric-leakage detection module 110 and is configured to be turned on or turned off according to the DC electric-leakage voltage $V_{L,DC}$ (or, the electric-leakage detection module 110 or the DC electric-leakage voltage $V_{L,DC}$ controls the switch module 120 to be turned on or turned off). The indicator 130 is electrically connected to the switch module 120 and configured to output an indication signal S1 according to the conduction of the switch module 120. As a result, when the electric-leakage occurs in the electronic equipment 20, the electric-leakage detection device 100 could automatically detect the electric-leakage of the electronic equipment 20 and output the indication signal S1 accordingly to warn surrounding people.

The electric-leakage detection module 110 is electrically connected to the power system 30 and the electronic equipment 20. For example, the electric-leakage detection module 110 is electrically connected to the neutral wire N of the power system 30 and the conductor of the electronic equipment 20, wherein the conductor is, for example, an outer casing (such as a metal shell) of the light pole 22, or an outer casing (such as a metal shell) of the light-emitting element 21. As a result, the electric-leakage (if any) of the electronic equipment 20 could be conducted to the electric-leakage detection module 110 through the conductor, and accordingly the electric-leakage detection module 110 could detect the electric-leakage (the AC electric-leakage voltage $V_{L,AC}$) from the electronic equipment 20.

The electric-leakage detection module 110 further includes a rectifier circuit 111, a voltage dividing circuit 112, a surge absorber 113 and a capacitor 114. The rectifier circuit 111 is electrically connected to the AC electric-leakage voltage $V_{L,AC}$ and configured to convert the AC electric-leakage voltage $V_{L,AC}$ into the DC electric-leakage voltage $V_{L,DC}$. The voltage dividing circuit 112 is electrically connected to the rectifier circuit 111 and is configured to transmit a divided voltage $V_{L,a}$ of the DC electric-leakage voltage $V_{L,DC}$, wherein the divided voltage $V_{L,a}$ is smaller than the DC electric-leakage voltage $V_{L,DC}$. The divided voltage $V_{L,a}$ is, for example, the voltage of a node a. The voltage dividing circuit 112 includes, for example, a plurality of resistors R1 to R5. The resistors R1 to R5 could be connected in series, in parallel or in combination thereof, as long as the resistors R1 to R5 could provide the divided voltage suitable for detecting, and the embodiment of the present invention does not limit the connection forms of the resistors. In addition, the resistor R5 could be connected to the capacitor 114 in parallel to reduce the voltage ripple. The surge absorber 113 is configured to suppress the surges at a DC input terminal for protecting the post-stage circuit. In an embodiment, the rectifier circuit 111 is, for example, a bridge rectifier circuit, and the surge absorber 113 is, for example, a piezoresistor.

The DC electric-leakage voltage $V_{L,DC}$ is, for example, greater than 20 V, such as 30 V, but the DC electric-leakage voltage $V_{L,DC}$ depends on the actual situation (for example, depending on the value of the AC electric-leakage voltage $V_{L,AC}$, or the value of the AC electric-leakage voltage $V_{L,AC}$ after rectification by the rectifier circuit 111), the embodiments pf the present invention are not limited to this. In addition, compared with the voltage value of the DC electric-leakage voltage $V_{L,DC}$, due to the divided voltage $V_{L,a}$ being smaller, the divided voltage $V_{L,a}$ is more suitable for the operation of the post-stage circuit, for example, suitable for the operation of the switch module 120.

The switch module 120 is electrically connected to the electric-leakage detection module 110, for example, electrically connected to the node a. The switch module 120 could be turned on (or conducted) or turned off according to the divided voltage $V_{L,a}$ of the DC electric-leakage voltage $V_{L,DC}$. The switch module 120 includes an optocoupler isolation circuit 120A and a DC voltage output switch circuit 120B. The DC voltage output switch circuit 120B is electrically connected to the optocoupler isolation circuit 120A. When the optocoupler isolation circuit 120A is turned on, the DC voltage output switch circuit 120B is turned on, so that a DC driving voltage $V_{S,DC}$ provided by the power conversion module 140 could be transmitted to the driving module 150 through the DC voltage output switch circuit 120B. The DC driving voltage $V_{S,DC}$ drops after passing through at least one component (for example, the diode 1452), and the dropped DC driving voltage $V'_{S,DC}$ is provided to the post-stage circuit of the power conversion module 140, for example, the indicators 130 and 135.

As shown in FIG. 3, the optocoupler isolation circuit 120A includes a light emitting diode 120A1 and an optocoupler switch (for example, a phototransistor) 120A2. The light emitting diode 120A1 is electrically connected to the DC electric-leakage voltage $V_{L,DC}$. For example, the light emitting diode 120A1 could be electrically connected to the DC electric-leakage voltage $V_{L,DC}$ through the voltage dividing circuit 112. The light emitting diode 120A1 is configured to emit light according to the DC electric-leakage voltage $V_{L,DC}$. The optocoupler switch 120A2 is disposed adjacent to the light emitting diode 120A1 and is configured to be turned on (shorting) according to light. For example, the divided voltage $V_{L,a}$ drives the light emitting diode 120A1 to emit light, and the optocoupler switch 120A2 is turned on by sensing the light. Furthermore, when the voltage (the divided voltage $V_{L,a}$) of the node a rises enough to make the parallel light emitting diode 120A1 be turned on (emit light), the optocoupler switch 120A2 is turned on accordingly.

The DC voltage output switch circuit 120B is electrically connected to the optocoupler isolation circuit 120A and the indicator 130. The DC voltage output switch circuit 120B could be turned on according to the conduction of the optocoupler isolation circuit 120A. When the DC voltage output switch circuit 120B is turned on, the DC driving voltage $V'_{S,DC}$ could be transmitted to the indicator 130 through the DC voltage output switch circuit 120B for driving the indicator 130. The DC voltage output switch circuit 120B includes a switch 120B1 and a Zener diode 120B2. The switch 120B1 is, for example, a bipolar transistor which has an emitter E, a collector C and a base B, wherein the base B is electrically connected to an electrode of the optocoupler isolation circuit 120A, for example, a source, and the collector C is electrically connected to an electrode of the optocoupler isolation circuit 120A, for example, the drain, and is electrically connected to the power conversion module 140, while the emitter E is electrically connected to the driving module 150. When the optocoupler isolation circuit 120A is turned on, the base B and the collector C of the switch 120B1 are turned on, so that the collector C and the emitter E are turned on. As a result, the DC driving voltage $V'_{S,DC}$ could be transmitted to the driving module 150 through the emitter E from the collector C and the emitter E.

The indicator 130 includes, for example, a light emitter which includes at least one light-emitting diode, and the aforementioned indication signal S1 is, for example, light. The indicator 135 is electrically connected to the switch module 120 and is configured to output an indication signal S2 according to the conduction of the switch module 120. For example, when the switch module 120 is turned on (for example, an electric-leakage occurs), the DC driving voltage $V'_{S,DC}$ is transmitted to the driving module 150 through the switch module 120, then the driving module 150 drives the indicator 130 to output the indication signal S1, and the DC driving voltage $V'_{S,DC}$ is transmitted to the indicator 135 through the switch module 120 to drive the indicator 135 to output the indication signal S2. When the switch module 120 is turned off (for example, the electric-leakage does not occur), the DC driving voltage $V'_{S,DC}$ is not transmitted to the driving module 150 through the switch module 120, the indicator 130 does not output the indication signal S1 and the indicator 135 also does not output the indication signal S2. In an embodiment, the indicator 135 is, for example, a buzzer, and the indication signal S2 is, for example, a buzzing sound. In another embodiment, the indicator 135 could be a vibrator, and the indication signal S2 is, for example, a vibration. In other embodiment, the indicator 135 could be a display, and the indication signal S2 is, for example, displayed text, graphics, and the like.

The power conversion module 140 is electrically connected to the power system 30 and the switch module 120. The power system 30 could provide an AC power supply voltage $V_{S,AC}$ to the power conversion module 140. The power conversion module 140 converts the AC power supply voltage $V_{S,AC}$ into a DC driving voltage $V_{S,DC}$, and outputs the DC driving voltage $V_{S,DC}$ to the switch module 120. In an embodiment, the power conversion module 140 includes an AC to DC circuit (not shown) for converting the AC power supply voltage $V_{S,AC}$ into the DC electric-leakage voltage $V_{L,DC}$. In addition, the power conversion module 140 may further include a battery (not shown) and a battery charging and discharging circuit (not shown), the battery charging and discharging circuit is electrically connected to the battery, so as to store the power supply of the power system 30 in the battery, or output the stored power of the battery. When the power conversion module 140 is electrically connected to the power system 30, the power system 30 supplies the power conversion module 140 and its post-stage circuit with power. When the power conversion module 140 is not coupled to the power system 30 or the power system 30 does not supply the power conversion module 140 with the AC power supply voltage $V_{S,AC}$, the battery supplies the post-stage circuit with its stored power (the DC driving voltage $V_{S,DC}$). In an embodiment, the DC driving voltage $V_{S,DC}$ is, for example, greater than 12V, such as 20V or other value.

The reverse polarity protection module 145 is electrically connected to the power conversion module 140 and the DC voltage output switch circuit 120B of the switch module 120. The reverse polarity protection module 145 could prevent damage caused by reverse connecting of positive and negative electrodes. The reverse polarity protection module 145 includes an inductor 1451 and a diode 1452, wherein the inductor 1451 is, for example, a common-mode inductor for EMI (Electromagnetic Interference) filtering, and the diode 1452 is configured to prevent reverse connecting of the positive and negative electrodes of the input voltage. In another embodiment, the electric-leakage detection device 100 also could omit the reverse polarity protection module 145.

The driving module 150 is electrically connected to the indicator 130 and the switch module 120 and is configured for driving the indicator 130 to output the indication signal S1 according to the DC driving voltage $V'_{S,DC}$. For example, when the switch module 120 is turned on, the DC driving voltage $V'_{S,DC}$ is transmitted to the indicator 130 through the driving module 150, and the indicator 130 output the indication signal S1 using the DC driving voltage $V'_{S,DC}$.

The counting module 160 is electrically connected to the driving module 150 and is configured to selectively output one of the first level signal and the second level signal to the driving module 150 when the DC voltage output switch circuit 120B is turned on. The driving module 150 is further configured to: when the driving module 150 receives the first level signal S3, the driving module 150 drive the indicator 130 to output the indication signal S1; when the driving module 150 receives the second level signal S4, the driving module 150 does not drive the indicator 130 to output the indication signal S1. In an embodiment, the first level signal S3 is, for example, one of a high level signal and a low level signal, and the second level signal S4 is, for example, the other one of the high level signal and the low level signal, wherein the high level signal is, for example, 2 V, and the low level signal is, for example, 0 V. In an embodiment, the first level signal S3 and the second level signal S4 could be outputted alternately and last for a period of time. At any time point in this period of time, the counting module 160 output one of the first level signal S3 and the second level signal S4; at the next time point in this period of time, the counting module 160 output the other of the first level signal S3 and the second level signal S4. As a result, the indication signal S1 is outputted intermittently (only when the first level signal S3 is received). In case of the indication signal S1 being light, under the control of the counting module 160, the indicator 130 emits light flickeringly. In addition, the intervals between any two adjacent time points in the aforementioned period of time may be substantially equal. The period of time may be seconds, minutes, hours, days, etc. Alternatively, the indication signal S1 could be outputted continuously until the electric-leakage condition is resolved, or the alarm is manually released.

The controller 170 is electrically connected to the driving module 150 and the optocoupler isolation circuit 120A of the switch module 120. The controller 170 could control the wireless communication module 180 to output an electric-leakage notification signal S5 to an external server (not shown) according to the conduction of the switch module 120. The user could monitor the status of the electronic equipment 20 through the external server. In an embodiment, the controller 170 is, for example, a Microcontroller Unit (MCU).

Figure 4:
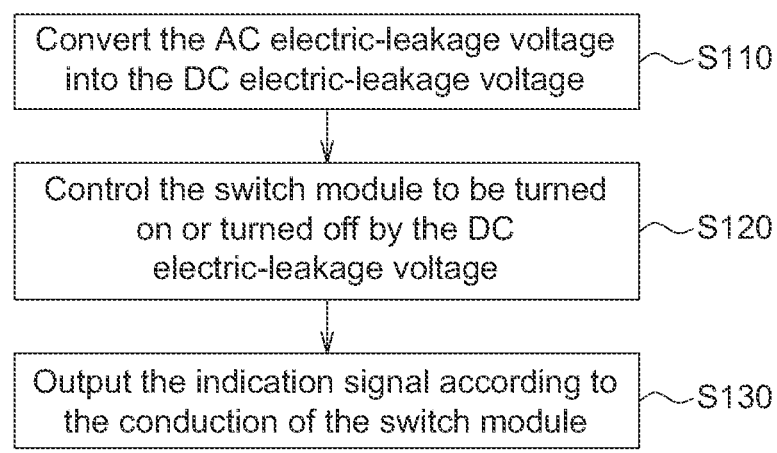

Referring to FIG. 4, which shows a flow chart of the electric-leakage detection method of the electric-leakage detection device 100 in FIG. 1.

In step S110, the electric-leakage detection module 110 converts the AC electric-leakage voltage $V_{L,AC}$ into the DC electric-leakage voltage $V_{L,DC}$.

In step S120, the switch module 120 is controlled to be turned on or turned off according to or by the DC electric-leakage voltage $V_{L,DC}$.

In step S130, the indicator 130 outputs the indication signal S1 according to the conduction of the switch module 120.

Other embodiments of the electric-leakage detection method according to the embodiment of the present invention have been described above, and it will not be repeated here.

To sum up, the embodiment of the present invention proposes an electric-leakage detection device, an electric-leakage detection system and an electric-leakage detection method using the same, which could detect the AC electric-leakage voltage (when the electric-leakage occurs), and convert the AC electric-leakage voltage into the DC electric-leakage voltage, wherein the DC electric-leakage voltage could drive the switch module to be turned on, and the indicator will output the indication signal to warn the occurrence of the electric-leakage.

While the invention has been described by way of example and in terms of the preferred embodiment (s), it is to be understood that the invention is not limited thereto. Based on the technical features embodiments of the present invention, a person ordinarily skilled in the art will be able to make various modifications and similar arrangements and procedures without breaching the spirit and scope of protection of the invention. Therefore, the scope of protection of the present invention should be accorded with what is defined in the appended claims.

What is claimed is:

1. An electric-leakage detection device, comprising:
   an electric-leakage detection module configured to convert an AC electric-leakage voltage into a DC electric-leakage voltage;
   a switch module electrically connected to the electric-leakage detection module and configured to be turned on or turned off according to the DC electric-leakage voltage; and
   an indicator electrically connected to the switch module and configured to output an indication signal according to conduction of the switch module;
   wherein the electric-leakage detection module is electrically connected to a neutral wire of a power system and a lamp to receive the AC electric-leakage voltage,
   wherein the switch module comprises:
   an optocoupler isolation circuit electrically connected to the electric-leakage detection module; and
   a DC voltage output switch circuit electrically connected to the optocoupler isolation circuit and the indicator, and configured to be turned on according to conduction of the optocoupler isolation circuit;
   wherein the indicator is configured to output the indication signal according to conduction of the DC voltage output switch circuit.

2. The electric-leakage detection device as claimed in claim 1, wherein the electric-leakage detection module further comprises:
   a rectifier circuit electrically connected to the AC electric-leakage voltage and configured to convert the AC electric-leakage voltage into the DC electric-leakage voltage; and
   a voltage dividing circuit electrically connected to the rectifier circuit and configured to provide a divided voltage of the DC electric-leakage voltage;
   wherein the switch module is configured to be turned on or turned off according to the divided voltage of the DC electric-leakage voltage.

3. The electric-leakage detection device as claimed in claim 1, further comprising:
   a power conversion module configured to output a DC driving voltage;
   wherein the switch module is electrically connected to the power conversion module; when the switch module is turned on, the DC driving voltage is transmitted to the indicator through the switch module.

4. The electric-leakage detection device as claimed in claim 3, wherein the indicator is a light-emitting element, and the electric-leakage detection device further comprises:
   a driving module electrically connected to the light-emitting element and the switch module and configured to drive the light-emitting element to output the indication signal according to the DC driving voltage.

5. The electric-leakage detection device as claimed in claim 4, further comprising:
   a counting module electrically connected to the driving module and configured to:
   output a first level signal to the driving module;
   wherein the driving module is further configured to:
   drive the light-emitting element to output the indication signal according to the first level signal.

6. The electric-leakage detection device as claimed in claim 5, wherein the counting module is further configured to:
   output a second level signal to the driving module;
   wherein the driving module is further configured to:
   not drive the light-emitting element to output the indication signal according to the second level signal.

7. The electric-leakage detection device as claimed in claim 1, wherein the DC voltage output switch circuit comprises an emitter, a collector and a base, wherein the base is electrically connected to the optocoupler isolation circuit, the collector is electrically connected to the power conversion module and the switch module, and the emitter is electrically connected to the indicator.

8. The electric-leakage detection device as claimed in claim 1, further comprising:
   a wireless communication module; and
   a controller electrically connected to the wireless communication module and configured to control the wireless communication module to output an electric-leakage notification signal according to the conduction of the switch module.

9. An electric-leakage detection system, comprising:
   an electric-leakage detection device as claimed in claim 1, disposed on the lamp and configured to detect the AC electric-leakage voltage from the lamp.

10. The electric-leakage detection system as claimed in claim 9, wherein the lamp comprises a light-emitting element and a light pole, and the light-emitting element is disposed on the light pole.

11. An electric-leakage detection method, comprising:
converting an AC electric-leakage voltage into a DC electric-leakage voltage by an electric-leakage detection module;
controlling a switch module to be turned on or turned off by the DC electric-leakage voltage; and
outputting an indication signal according to conduction of the switch module by an indicator,
wherein the switch module comprises an optocoupler isolation circuit and a DC voltage output switch circuit, and the DC voltage output switch circuit is electrically connected to the optocoupler isolation circuit and the indicator; the electric-leakage detection method further comprises:
controlling the DC voltage output switch circuit to be turned on by conduction of the optocoupler isolation circuit; and
outputting the indication signal according to conduction of the DC voltage output switch circuit by the indicator.

12. The electric-leakage detection method as claimed in claim 11, wherein the electric-leakage detection module further comprises a rectifier circuit and a voltage dividing circuit; the leakage detection method further comprises:
converting the AC electric-leakage voltage into the DC electric-leakage voltage by the rectifier circuit;
providing a divided voltage of the DC electric-leakage voltage by the voltage dividing circuit; and
controlling the switch module to be turned on or turned off by the divided voltage of the DC electric-leakage voltage.

13. The electric-leakage detection method as claimed in claim 11, further comprising:
outputting a DC driving voltage by a power conversion module;
when the switch module is turned on, the DC driving voltage is transmitted to the indicator through the switch module.

14. The electric-leakage detection method as claimed in claim 13, wherein the indicator is a light-emitting element; the electric-leakage detection method further comprises:
driving the light-emitting element to output the indication signal according to the DC driving voltage by a driving module.

15. The electric-leakage detection method as claimed in claim 14, further comprising:
outputting a first level signal to the driving module by a counting module; and
driving the light-emitting element to output the indication signal according to the first level signal by the driving module.

16. The electric-leakage detection method as claimed in claim 15, further comprising:
further outputting a second level signal to the driving module by the counting module; and
not driving the light emitting element to output the indication signal according to the second level signal by the driving module.

17. The electric-leakage detection method as claimed in claim 11, wherein the DC voltage output switch circuit comprises an emitter, a collector and a base, wherein the base is electrically connected to the optocoupler isolation circuit, the collector is electrically connected to the power conversion module and the switch module, and the emitter is electrically connected to the indicator; the electric-leakage detection method further comprises:
when the optocoupler isolation circuit is turned on, the collector and the base are conducted;
when the collector and the base are conducted, the collector and the emitter are conducted to make the indicator output the indication signal.

18. The electric-leakage detection method as claimed in claim 11, further comprising:
controlling a wireless communication module to output an electric-leakage notification signal according to the conduction of the switch module by the controller.

* * * * *